(12) United States Patent
Matoba

(10) Patent No.: US 7,334,010 B2
(45) Date of Patent: Feb. 19, 2008

(54) FEEDBACK DIGITAL FILTER

(75) Inventor: Kenjiro Matoba, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 717 days.

(21) Appl. No.: 10/252,536

(22) Filed: Sep. 24, 2002

(65) Prior Publication Data

US 2003/0177157 A1    Sep. 18, 2003

(30) Foreign Application Priority Data

Mar. 12, 2002   (JP)   ............................ 2002-066488

(51) Int. Cl.
G06F 17/10        (2006.01)
(52) U.S. Cl. .................................... 708/316
(58) Field of Classification Search ......... 708/300–323
See application file for complete search history.

(56) References Cited

U.S. PATENT DOCUMENTS

| | | | | |
|---|---|---|---|---|
| 4,117,541 A | * | 9/1978 | Ali .............................. | 708/320 |
| 4,157,457 A | * | 6/1979 | Sakoe et al. ................... | 708/16 |
| 4,809,208 A | | 2/1989 | Hansen et al. | |
| 5,198,604 A | * | 3/1993 | Higashi et al. ................ | 84/626 |
| 5,221,804 A | * | 6/1993 | Shibukawa .................. | 84/658 |
| 5,311,459 A | * | 5/1994 | D'Luna et al. ............. | 708/319 |
| 5,367,476 A | * | 11/1994 | Elliott ......................... | 708/316 |
| 5,506,798 A | * | 4/1996 | Shimada et al. ............ | 708/315 |
| 5,594,675 A | * | 1/1997 | Peng .......................... | 708/313 |
| 5,642,382 A | * | 6/1997 | Juan ........................... | 708/323 |
| 5,831,879 A | * | 11/1998 | Yom et al. .................. | 708/316 |
| 5,904,731 A | * | 5/1999 | Matsui ....................... | 708/320 |
| 6,131,071 A | * | 10/2000 | Partyka et al. ................ | 702/16 |
| 6,198,035 B1 | * | 3/2001 | Saito et al. .................... | 84/617 |
| 6,510,445 B2 | * | 1/2003 | Takano ....................... | 708/316 |

FOREIGN PATENT DOCUMENTS

| | | |
|---|---|---|
| JP | 63-103509 | 5/1988 |
| JP | 63-278411 | 11/1988 |
| JP | 1-296706 | 11/1989 |
| JP | 02-166819 | 6/1990 |
| JP | 03-228422 | 10/1991 |
| JP | 05-335888 | 12/1993 |
| JP | 06-168575 | 6/1994 |
| JP | 08-221359 | 8/1996 |
| JP | 11-220357 | 8/1999 |

* cited by examiner

*Primary Examiner*—Chat C. Do
(74) *Attorney, Agent, or Firm*—Rabin & Berdo PC

(57) ABSTRACT

A digital filter includes a data storage section, a filter coefficient storage section, a multiplier, an accumulative adder section, a data output section and a control section. The data storage section stores the latest multiple input data for every channel and outputs the stored input data in response to a selection signal. The filter coefficient storage section stores predetermined filter coefficient corresponding to the multiple input data. The accumulative adder section adds the result of multiplication of multiple data from the multiplier for every channel. The data output section holds the result of addition in the accumulative adder section and outputting output data. The control section produces the selection signals for sequentially selecting multiple input data corresponding to the channel of the input data every time when the input data is supplied to the data storage section, and produces operating control signals supplied to the filter coefficient storage section, the accumulative adder section and the data output section.

15 Claims, 6 Drawing Sheets

DIGITAL FILTER ACCORDING TO THIRD EMBODIMENT OF THE INVENTION

OPERATION OF DIGITAL FILTER IN FIG. 1

DIGITAL FILTER ACCORDING TO SECOND EMBODIMENT OF THE INVENTION

OPERATION OF DIGITAL FILTER IN FIG. 3

DIGITAL FILTER ACCORDING TO THIRD EMBODIMENT OF THE INVENTION

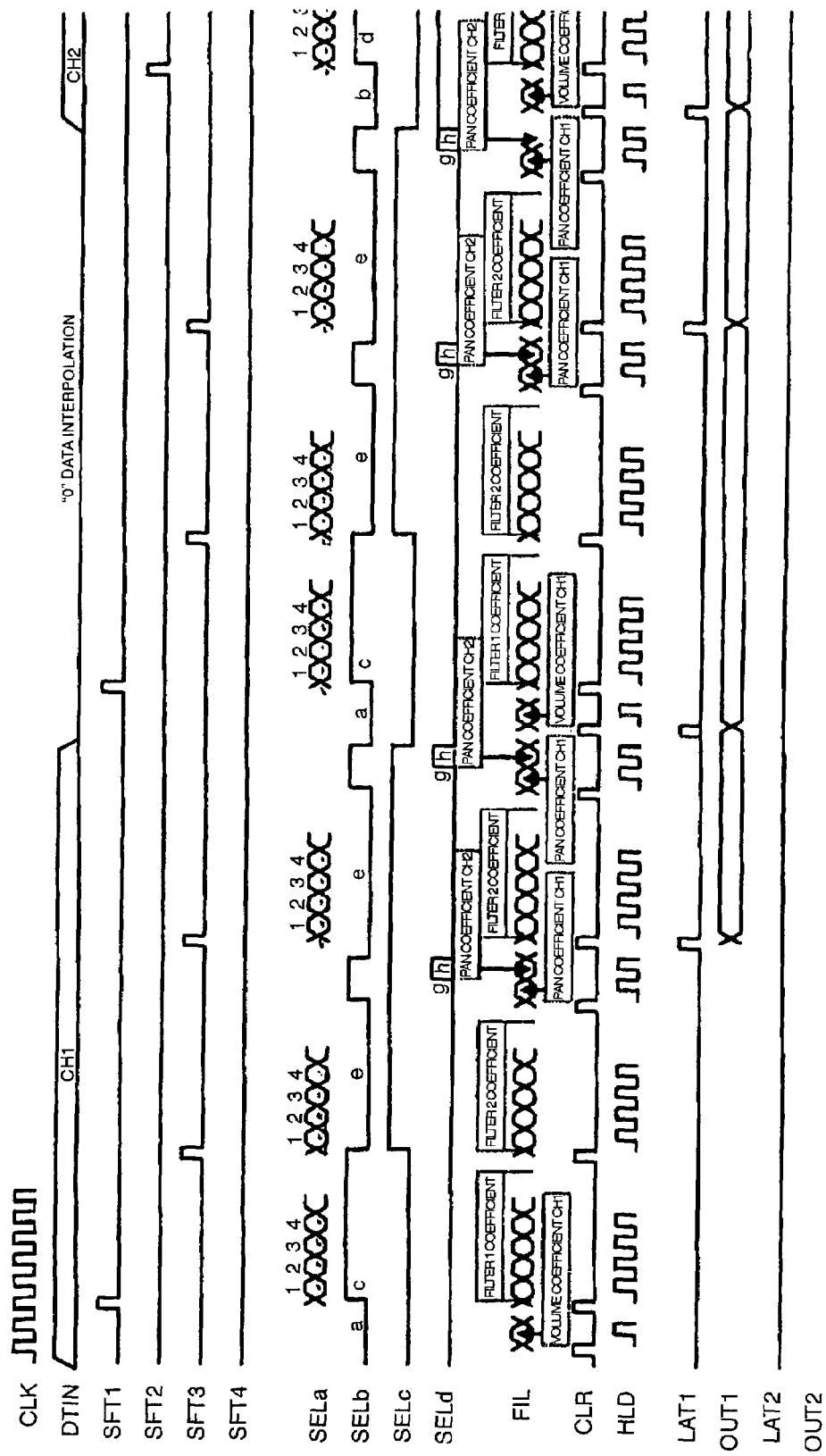

FEEDBACK DIGITAL FILTER

FIELD OF THE INVENTION

The invention relates to a digital filter for subjecting a digitized sound signal to a digitization processing, particularly to a digital filter capable of processing multichannel data at the same time.

BACKGROUND OF THE INVENTION

A conventional digital filter includes first and second shifting sections which shift an input data IN1 of a first channel (hereinafter referred to as first channel data IN1) and an input data IN2 of a second channel (hereinafter referred to as second channel data IN2) in synchronization with the same clock signal CLK and hold them. The first and second shifting sections have multiple shift registers SR which are connected to each other in cascade. Output data of respective shift registers and the first and second channel data IN1 and IN2 are supplied to an input side of a multiplexer MUX.

The multiplexer MUX alternately selects and outputs output data of the first and second shifting sections in response to a level of the clock signal CLK, namely, "H" or "L" thereof, wherein an output side of the multiplexer MUX is connected to an FIR (Finite Impulse Response) filter section. The FIR filter section comprises multiple multipliers MUL for multiplying respective data outputted by the multiplexer MUX by filter coefficient, and multiple adders for adding the result of multiplication by the multiple multipliers. An output side of the FIR filter is connected to an output section.

The output section comprises two flip-flops FF and an inverter, and it holds output data of the FIR filter section in response to the clock signal CLK, and outputs output data OUT1, OUT2 relative to the first and second channels.

However, according to the conventional digital filter, it is necessary that the first and second channels have the same sampling frequency, and hence it is limited in the scope of application. Further, since the FIR filter section requires multiple multipliers and adders, and hence it has been desired to more simplify the scale of circuit.

SUMMARY OF THE INVENTION

It is an object of the invention to solve the problems of the conventional digital filter and to provide a digital filter for multichannels which is simplified in a scale of circuits and is capable of processing input data which are different in sampling frequency.

BRIEF DESCRIPTION OF THE DRAWINGS

FIG. 6 is a timing chart showing the operation of the digital filter shown in FIG. 5.

PREFERRED EMBODIMENT OF THE INVENTION

Figure 1:
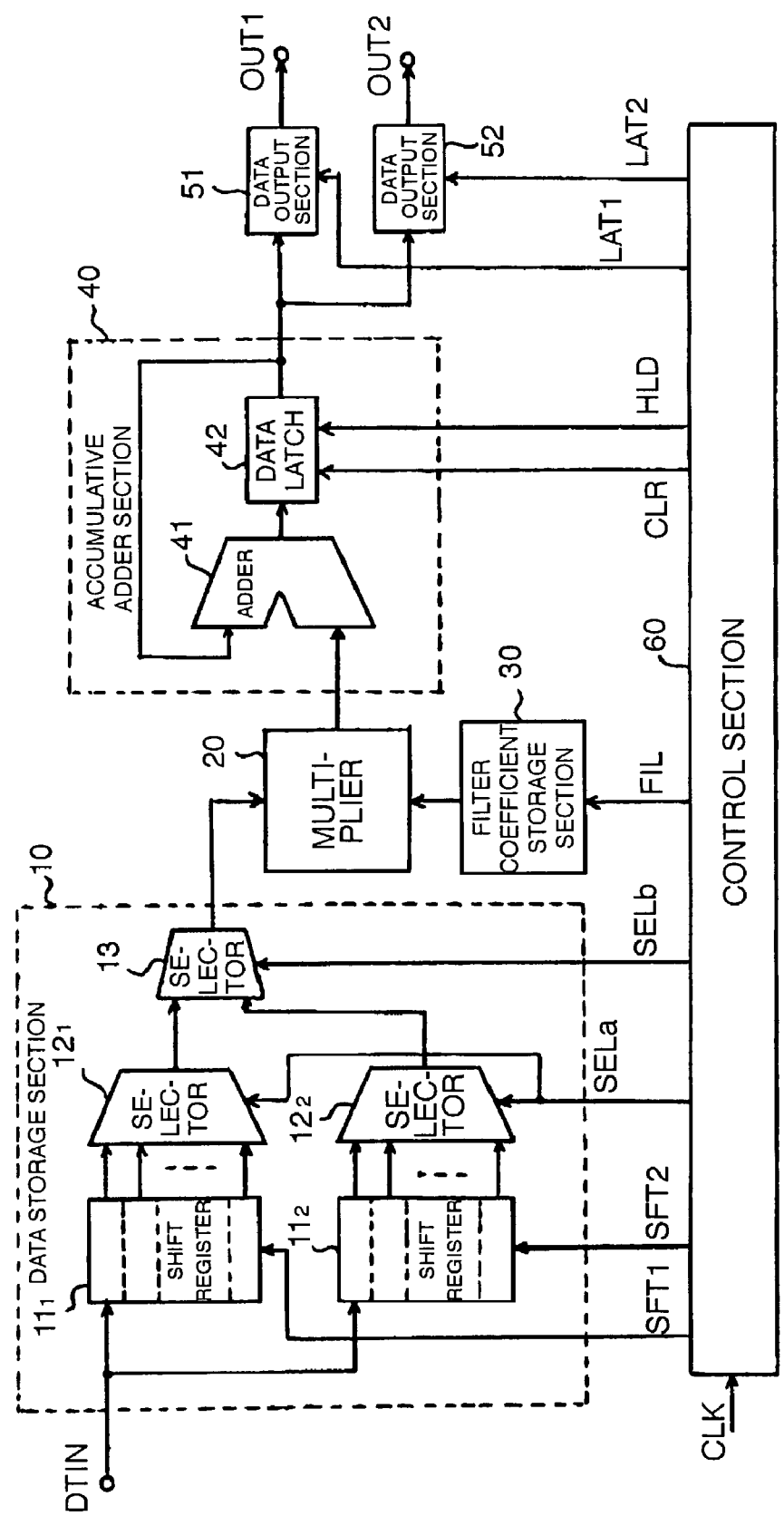
FIG. 1 is a circuit diagram showing the configuration of a digital filter according to a first embodiment of the invention.

FIG. 1 is a circuit diagram showing the configuration of a digital filter according to a first embodiment of the invention. The digital filter comprises a data storage section 10, a multiplier 20, a filter coefficient storage section 30, an accumulative adder section 40, data output sections 51, 52 and a control section 60.

The data storage section 10 shifts and holds the latest multichannel data from input data DTIN formed by time sharing and multiplying multichannel data for every time. Provided that the ratio of sampling frequencies of inputted first and second channel data is 2:1, the input data DTIN is supplied to the data storage section 10 while the first channel data is inserted in every frame and the second channel data is inserted once in two frames.

The data storage section 10 includes shift registers $11_1$, $11_2$ corresponding to the first and second channels, and it holds the input data DTIN in response to shift signals SFT1, SFT2 which are supplied from the control section 60, and sequentially shifts the data held hitherto so as to store past multiple data.

Output sides of the shift registers $11_1$, $11_2$ of each stage are connected to input sides of selectors $12_1$, $12_2$. The selectors $12_1$, $12_2$ select any one of output data of the shift registers $11_1$, $11_2$ in response to a selection signal SELa which is supplied from the control section 60 and output the selected data. Output sides of the selectors $12_1$, $12_2$ are respectively connected to an input side of a selector 13. The selector 13 selects and outputs output data of either selector $12_1$ or selector $12_2$ in response to a selection signal SELb which is supplied from the control section 60, and an output side of the selector 13 is connected to one input side of the multiplier 20.

The filter coefficient storage section 30 is connected to the other input side of the multiplier 20. The filter coefficient storage section 30 stores a filter coefficient in advance for subjecting the input data DTIN to a filter processing, and selects a given filter coefficient in response to a control signal FIL which is supplied from the control section 60 and outputs the given filter coefficient to the multiplier 20.

The multiplier 20 multiplies the data output from the data storage section 10 by the filter coefficient which is supplied from the filter coefficient storage section 30, and an output side of the multiplier 20 is connected to the accumulative adder section 40.

The accumulative adder section 40 comprises an adder 41 and a data latch 42. Data from the multiplier 20 is supplied to a first input side of the adder 41, and an output side of the adder 41 is connected to an input side of the data latch 42, and an output side of the data latch 42 is connected to a second input side of the adder 41.

In the accumulative adder section 40, firstly the content of the data latch 42 is cleared to become 0 in response to a clear signal CLR which is supplied from the control section 60. Secondly, data which is supplied from the multiplier 20 is added to data which is held in the data latch 42 (i.e. 0) by the adder 41, and the result of addition is held in the data latch 42 in response to a hold signal HLD which is supplied from the control section 60. Subsequently, the hold signal HLD is supplied from the control section 60 every time when data is outputted from the multiplier 20, and the data from the multiplier 20 are accumulatively added to, and are held in the data latch 42.

The data output sections 51, 52 are connected to an output side of the data latch 42. The data output sections 51, 52 hold a final result of addition by the accumulative adder section 40 in response to latch signals LAT1, LAT2 which are supplied from the control section 60, and output it as output data OUT1, OUT2 of the first and second channels.

The control section 60 produces and outputs timing signals for controlling operation of the foregoing respective components in response to a clock signal CLK.

Figure 2:
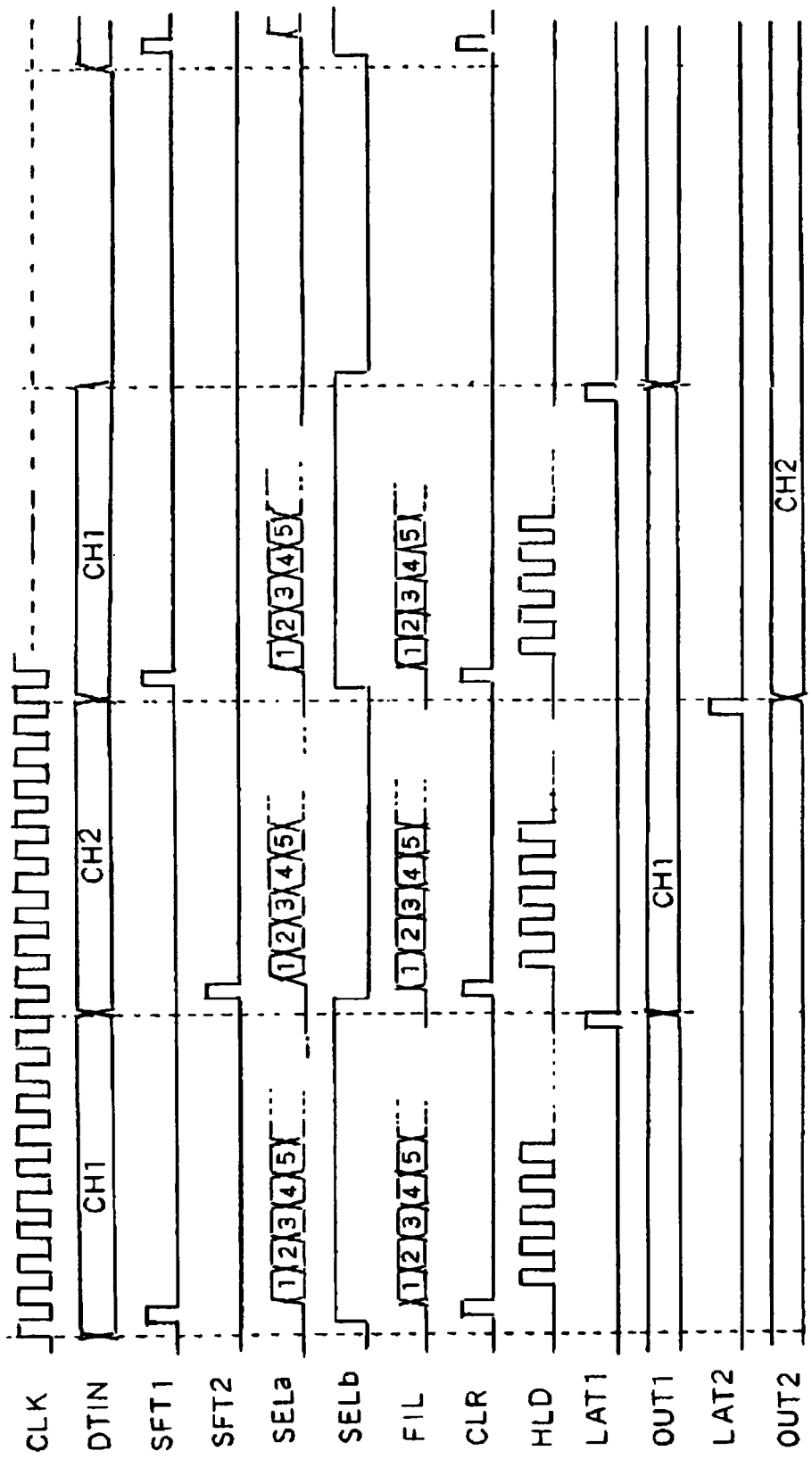
FIG. 2 is a timing chart showing the operation of the digital filter shown in FIG. 1.

FIG. 2 is a timing chart showing the operation of the digital filter shown in FIG. 1. The operation of the digital filter shown in FIG. 1 is described hereinafter with reference to FIG. 2.

When the first channel data CH1 is inputted to the input data DTIN, the shift signal SFT1 is supplied from the control section 60 to the shift register $11_1$ of the data storage section 10. As a result, the past first channel data held in the shift register $11_1$ are sequentially shifted to subsequent stages and the latest data $CH_1$ is stored in the first stage. Further, the selection signal SELb for selecting the first channel (i.e. the selector $12_1$) side is outputted from the control section 60 to the selector 13 of the data storage section 10. Still further, the clear signal CLR is supplied from the control section 60 to the accumulative adder section 40 so that the content of the data latch 42 of the accumulative adder section 40 is cleared to become 0.

Subsequently, the selection signal SELa for selecting the first data is outputted from the control section 60 to the selector $12_1$ of the data storage section 10 while a control signal FIL for selecting and outputting the first filter coefficient is outputted from the control section 60 to the filter coefficient storage section 30. As a result, the first data of the shift register $11_1$ is multiplied by the first filter coefficient of the filter coefficient storage section 30 in the multiplier 20, and the result of multiplication is outputted to the accumulative adder section 40. The adder 41 of the accumulative adder section 40 adds the result of multiplication supplied from the multiplier 20 to the result of accumulation held in the data latch 42 (in this case 0). At this time, the hold signal HLD is supplied from the control section 60 to the data latch 42 so that the result of addition of the adder 41 is held in the data latch 42 as a new result of accumulation.

Thereafter, the selection signal SELa for selecting the second data, the third data, . . . is sequentially supplied from the control section 60 to the selector $12_1$ of the data storage section 10 while the control signal FIL for selecting and outputting the second filter coefficient, the third filter coefficient, . . . sequentially outputted from the control section 60 to the filter coefficient storage section 30. Accordingly, the second data, the third data, . . . of the shift register $11_1$ are multiplied by the second filter coefficient, the third filter coefficient . . . of the filter coefficient storage section 30 in the multiplier 20. The results of multiplication are accumulatively added to and held in the accumulative adder section 40 in response to the hold signal HLD which is sequentially supplied from the control section 60 to the accumulative adder section 40.

When the filter processing relative to the first channel data stored in the shift register $11_1$ is completed, the latch signal LAT1 is outputted from the control section 60 to the data output section 51. As a result, the data held in the data latch 42 of the accumulative adder section 40 is held in the data output section 51, and outputted as the output data OUT1.

Then, when the second channel data CH2 is inputted to the input data DTIN, the shift signal SFT2 is supplied from the control section 60 to the shift register $11_2$ of the data storage section 10. As a result, the past second channel data held in the shift register $11_2$ are sequentially shifted to subsequent stages and the latest data CH2 is stored in the first stage. Further, the selection signal SELb for selecting the second channel (i.e. the selector $12_2$) side is outputted from the control section 60 to the selector 13 of the data storage section 10. Still further, the clear signal CLR is supplied from the control section 60 to the accumulative adder section 40 so that the content of the data latch 42 of the accumulative adder section 40 is cleared to become 0.

The operations of the components which have been made thereafter are the same as those of the case of the first channel. When the filter processing relative to the second channel data CH2 stored in the shift register $11_2$ is completed, the latch signal LAT2 is outputted from the control section 60 to the data output section 52. As a result, the data held in the data latch 42 of the accumulative adder section 40 is held in the data output section 52 and outputted as the output data OUT2.

As mentioned above, the digital filter according to the first embodiment includes two shift registers $11_1$, $11_2$ for shifting and holding the input data DTIN which are formed by timesharing and multiplying multiple data and inputting the input data to the data storage section 10 every channel of the input data DTIN. And the digital filter further includes the multiplier 20, the filter coefficient storage section 30 and the accumulative adder section 40 for sequentially reading the data held in the shift registers $11_1$, $11_2$ so as to subject them to the filter processing. Since the filter processing can be effected in response to the inputted channel data, there is an advantage that the multichannel data having different sampling frequencies can be subjected to the filter processing. Further, since it is sufficient to provide a set of the multiplier 20 and the accumulative adder section 40 irrespective of the number of the channel data, the number of stage of the shift register $11_1$ and the like, there is an advantage that the scale of circuit is simplified.

Figure 3:
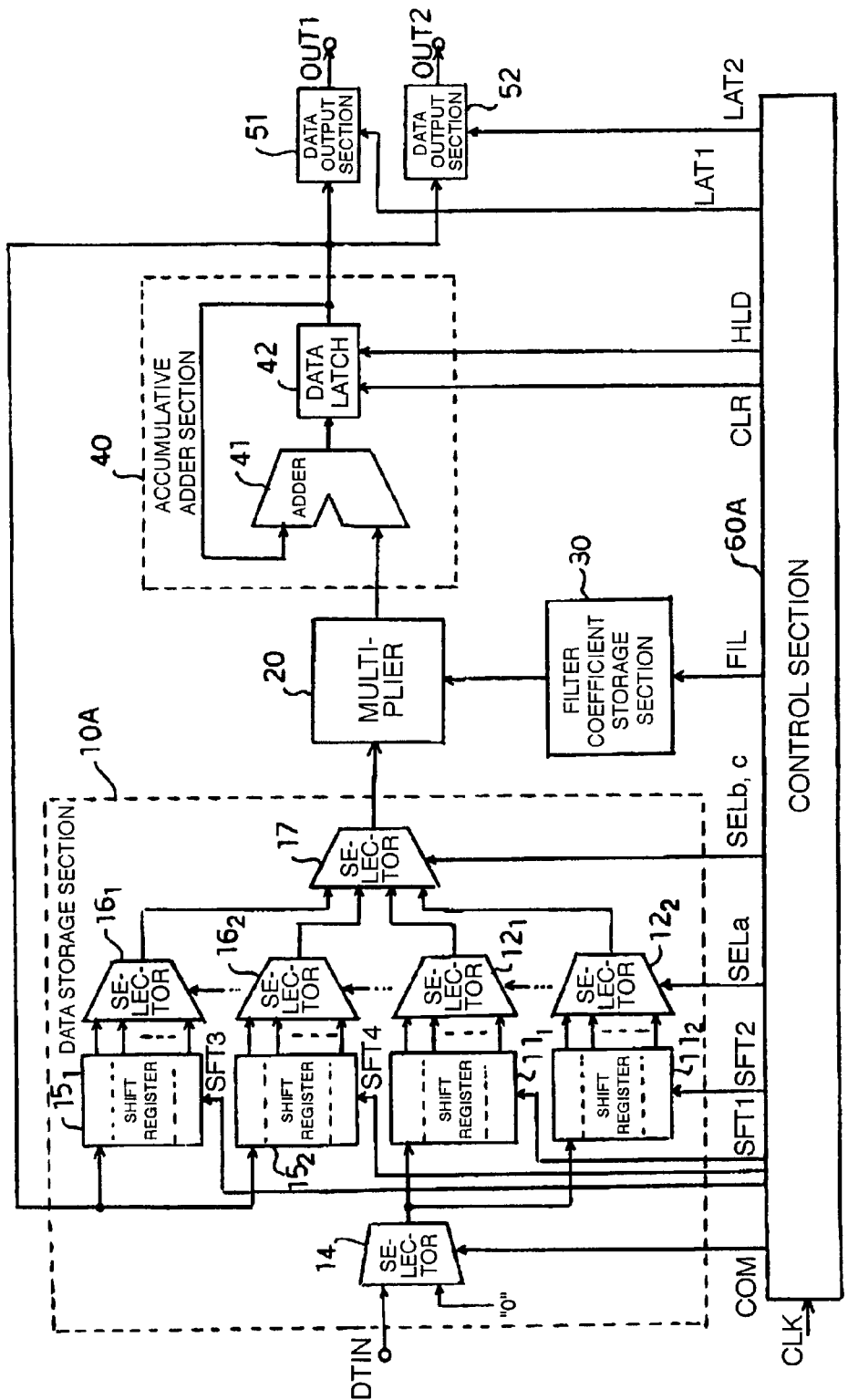
FIG. 3 is a circuit diagram showing the configuration of a digital filter according to a second embodiment of the invention.

FIG. 3 is a circuit diagram showing the configuration of a digital filter according to a second embodiment of the invention.

The digital filter of the second embodiment is provided with an interpolation processing function for inserting interpolation data and producing output data during one sampling cycle of an input data DTIN. Components which are the same as those of the first embodiment are depicted by the common reference numerals.

The digital filter includes a data storage section 10A to which a function to produce interpolation data is added, instead of the data storage section 10 in FIG. 1, and a control section 60A to which a function is added corresponding to the data storage section 10A.

The data storage section 10A includes a selector 14 for switching between the input data DTIN and "0" data for interpolation and inputting the switched data thereto in response to a control signal COM which is supplied from the control section 60A. Shift registers $11_1$, $11_2$ corresponding to first and second channels are connected to an output side of the selector 14. The shift registers $11_1$, $11_2$ hold data supplied from the selector 14 in response to shift signals SFT1, SFT2 which are supplied from the control section 60A, and sequentially shift data which have been held hitherto so as to store past multiple data.

Output sides of the shift registers $11_1$, $11_2$ of each stage are connected to input sides of selectors $12_1$, $12_2$. The selectors $12_1$, $12_2$ select output data of the shift registers $11_1$, $11_2$ in response to a selection signal SELa which is supplied from the control section 60A and output the selected data.

Further, the data storage section 10A includes shift registers $15_1$, $15_2$ for holding data which has been subjected to filter processing by the accumulative adder section 40 and fed back thereby in response to shift signals SFT3, SFT4 which are supplied from the control section 60A, and sequentially shifting the data which have been held hitherto and store the past multiple data therein.

Output sides of the shift registers $15_1$, $15_2$ of each stage are connected to input sides of selectors $16_1$, $16_2$. The selectors $16_1$, $16_2$ select output data from the shift registers $15_1$, $15_2$ in response to the selection signal SELa which is supplied from the control section 60A and output the selected output data.

Respective output sides of the selectors $12_1$, $12_2$ and those of the selectors $16_1$, $16_2$ are connected to an input side of a selector 17. The selector 17 selects any one of output data of the selectors $12_1$, $12_2$ and selectors $16_1$, $16_2$ in response to selection signals SELb, SELc which are supplied from the control section 60A and output the selected data. An output side of the selector 17 is connected to one input side of multiplier 20. Other configurations of the digital filter are the same as those of the first embodiment.

Figure 4:
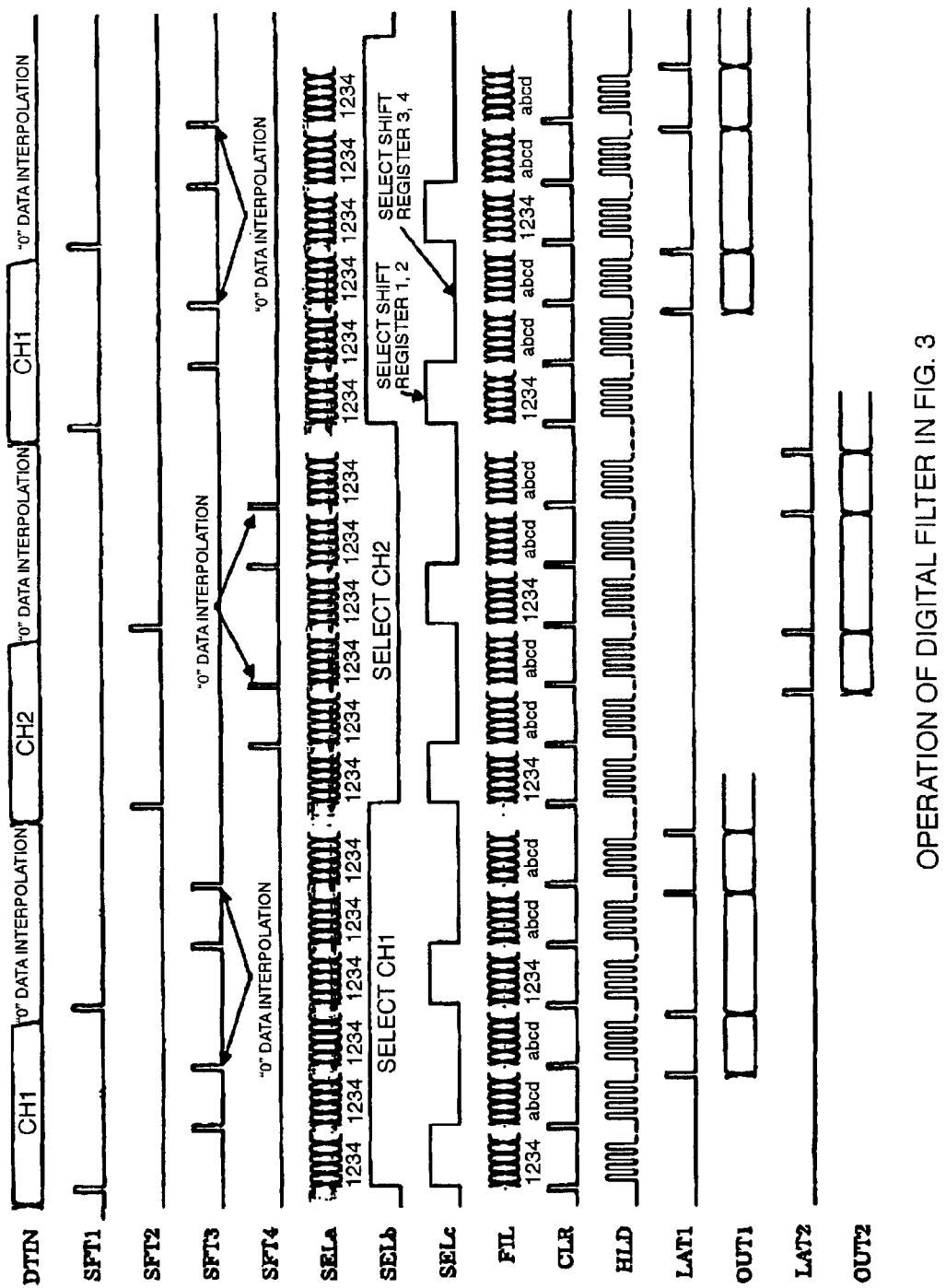
FIG. 4 is a timing chart showing the operation of the digital filter shown in FIG. 3.

FIG. 4 is a timing chart showing the operation of the digital filter shown in FIG. 3. The operation of the digital filter shown in FIG. 3 is described hereinafter with reference to FIG. 4.

When first channel data CH1 is inputted to the input data DTIN, a control signal COM for selecting the input data DTIN side is supplied from the control section 60A to the selector 14 of the data storage section 10A, and further the shift signal SFT1 is supplied from the control section 60A to the shift register $11_1$ of the data storage section 10A. As a result, the past first channel data held in shift register $11_1$ are sequentially shifted to subsequent stages and the latest data CH1 is stored in the first stage. Further, the selection signals SELb, SELc for selecting the selector $12_1$ side are outputted from the control section 60A to the selector 17 of the data storage section 10A. At the same time, a clear signal CLR is supplied from the control section 60 to an accumulative adder section 40 so that the content of a data latch 42 of the accumulative adder section 40 is cleared to become 0.

Subsequently, the selection signal SELa for selecting the first data is outputted from the control section 60A to the selector $12_1$ of the data storage section 10A and a control signal FIL for selecting and outputting the first filter coefficient is outputted from the control section 60 to a filter coefficient storage section 30. As a result, the first data of the shift register $11_1$ is multiplied by the first filter coefficient of the filter coefficient storage section 30 in the multiplier 20, and the result of multiplication is outputted to the accumulative adder section 40. The adder 41 of the accumulative adder section 40 adds the result of multiplication supplied from the multiplier 20 to the result of accumulation held in the data latch 42 (in this case 0). At this time, a hold signal HLD is supplied from the control section 60A to the data latch 42 so that the result of addition of the adder 41 is held in the data latch 42 as a new result of accumulation.

Thereafter, the selection signal SELa for selecting the second data, the third data, . . . is supplied from the control section 60A to the selector $12_1$ and the control signal FIL for selecting and outputting the second filter coefficient, the third filter coefficient, are sequentially outputted from the control section 60A to the filter coefficient storage section 30. Accordingly, the multiplier 20 multiplies the second data, the third data, . . . of the shift register $11_1$ by the second filter coefficient, the third filter coefficient, . . . of the filter coefficient storage section 30. The results of multiplication are accumulatively added thereto and held in the accumulative adder section 40 in response to the hold signal HLD which is sequentially supplied from the control section 60A to the accumulative adder section 40.

When the filter processing relative to the first channel data stored in the shift register $11_1$ is completed, the shift signal SFT3 is supplied from the control section 60A to the shift register $15_1$ of the data storage section 10A. As a result, the past first channel data held in shift register $15_1$ and subjected to the filter processing are sequentially shifted to subsequent stages and the latest data CH1 which has been subjected to the filter processing is stored in the first stage. Further, the selection signals SELb, SELc for selecting the selector $15_1$ side are outputted from the control section 60A to the selector 17 of the data storage section 10A. At the same time, the clear signal CLR is supplied from the control section 60A to the accumulative adder section 40 so that the content of the data latch 42 of the accumulative adder section 40 is cleared to become 0.

Subsequently, the selection signal SELa for selecting the first data is outputted from the control section 60A to the selector $16_1$ of the data storage section 10A and the control signal FIL for selecting and outputting ath filter coefficient is outputted from the control section 60A to the filter coefficient storage section 30. As a result, the first data of the shift register $15_1$ is multiplied by the ath filter coefficient of the filter coefficient storage section 30 in the multiplier 20, and the result of multiplication is outputted to the accumulative adder section 40. The adder 41 of the accumulative adder section 40 adds the result of multiplication supplied from the multiplier 20 to the result of accumulation held in the data latch 42 (in this case 0). At this time, the hold signal HLD is supplied from the control section 60A to the data latch 42 so that the result of addition of the adder 41 is held in the data latch 42 as a new result of accumulation.

Thereafter, the selection signal SELa for selecting the second data, the third data, . . . is supplied from the control section 60A to the selector $16_1$ of the data storage section 10A and the control signal FIL for selecting and outputting bth filter coefficient, cth filter coefficient, . . . are sequentially outputted from the control section 60A to the filter coefficient storage section 30. As a result, the multiplier 20 multiplies the second data, the third data, . . . of the shift register $15_1$ by the bth filter coefficient, the cth filter coefficient, . . . of the filter coefficient storage section 30. The results of multiplication are accumulatively added to and held in the accumulative adder section 40 in response to the hold signal HLD which is sequentially supplied from the control section 60A to the accumulative adder section 40.

When the filter processing relative to the first channel data stored in the shift register $15_1$ is completed, a latch signal LAT1 is outputted from the control section 60A to the data output section 51. At the same time, the shift signal SFT3 is supplied from the control section 60A to the shift register $15_1$ of the data storage section 10A. As a result, the data held in the data latch 42 of the accumulative adder section 40 is held in the data output section 51, and outputted as the output data OUT1. Further, the past first channel data held in shift register $15_1$ and subjected to the filter processing are sequentially shifted to subsequent stages and latest data CH1which has been subjected to the filter processing is stored in the first stage.

Next, the clear signal CLR is supplied from the control section 60A to the accumulative adder section 40 so that the content of the data latch 42 of the accumulative adder section 40 is cleared to become 0.

Thereafter, the selection signal SELa for selecting the first data, the second data, . . . is outputted from the control section 60A to the selector $16_1$ of the data storage section 10A and the control signal FIL for selecting and outputting the ath filter coefficient, the bth filter coefficient, . . . is sequentially outputted from the control section 60A to the filter coefficient storage section 30. As a result, the first data, the second data, . . . of the shift register $15_1$ is multiplied by the ath filter coefficient, the bth filter coefficient, . . . of the filter coefficient storage section 30 in the multiplier section multiplier 20. The results of multiplication are accumulatively added to and held in the accumulative adder section 40 in response to the hold signal HLD which is sequentially supplied from the control section 60A to the accumulative adder section 40.

When the filter processing relative to the first channel data stored in the shift register $15_1$ is completed, the latch signal LAT1is outputted from the control section 60A to the data output section 51. As a result, the data stored in the data latch 42 of the accumulative adder section 40 is held in the data output section 51, and outputted as the output data OUT1.

The control signal COM for selecting the "0" data for interpolation is supplied from the control section 60A to the selector 14 of the data storage section 10A. As a result, the past first channel data held in the shift register $11_1$ are sequentially shifted to the subsequent stages, and the "0" data for interpolation is stored in the first stage. The operations of the components which have been made thereafter are the same as those of the input data DTIN.

Subsequently, when the second channel data CH2is inputted to the input data DTIN, the selection signals SELb, SELc for selecting the selectors $12_2$, $16_2$ are supplied from the control section 60A to the selector 17, wherein the same processing as made in the first channel data CH1is effected.

As mentioned above, the digital filter of the second embodiment includes the data storage section 10A capable of effecting interpolation processing and the control section 60A for controlling the data storage section 10A. As a result, the second embodiment has an advantage that it can smoothly output the output data OUT1, OUT2 by the interpolation processing in addition to the advantage of the first embodiment.

Figure 5:
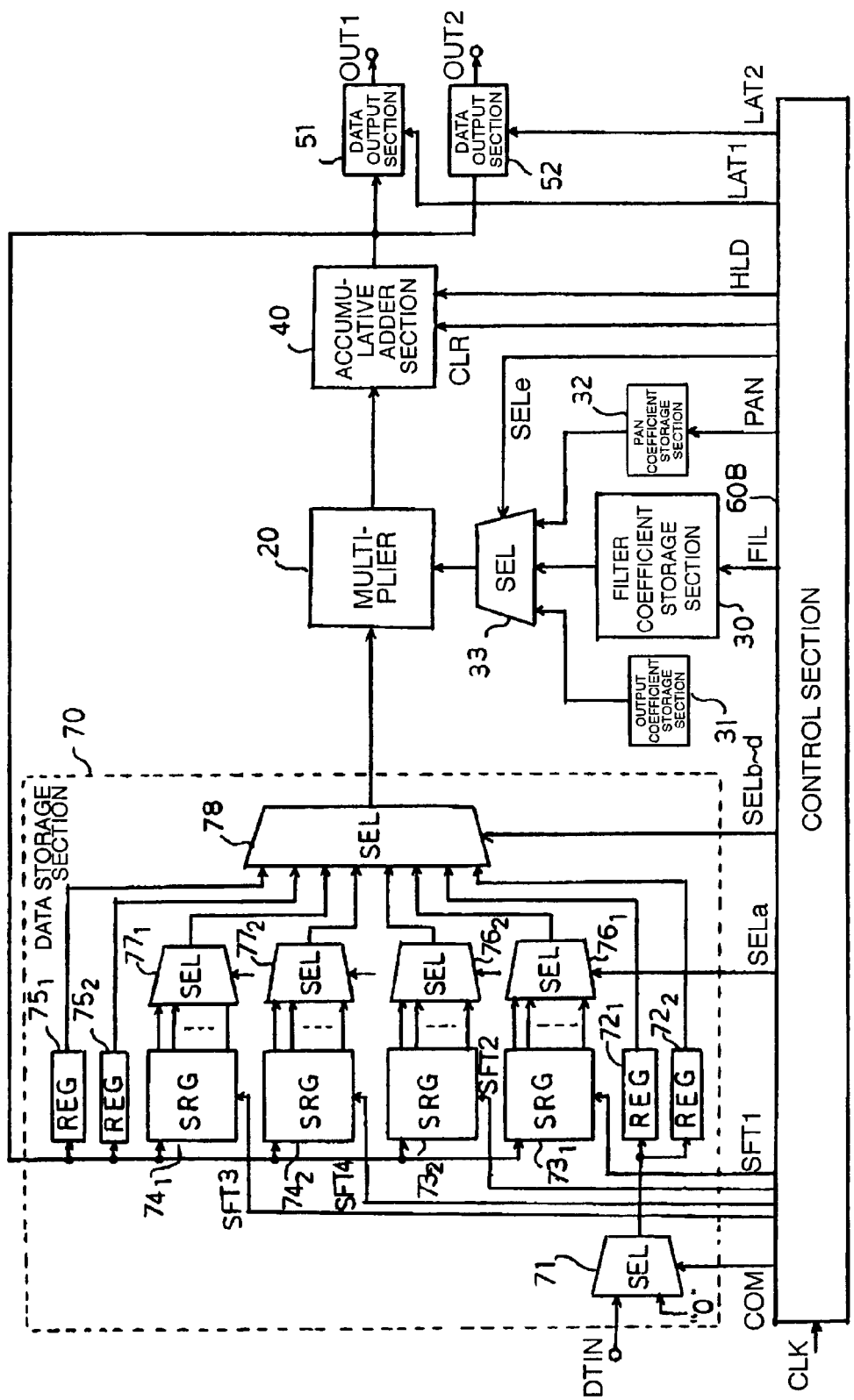
FIG. 5 is a circuit diagram showing the configuration of a digital filter according to a third embodiment of the invention.

FIG. 5 is a circuit diagram showing the configuration of a digital filter according to a third embodiment of the invention.

The digital filter of the third embodiment has a volume processing function for controlling an output level and a pan processing function for producing output data which is formed by mixing input multichannel data in a given ratio in addition to the interpolation processing function of the second embodiment, wherein components which are the same as those of the second embodiment are depicted by the common reference numerals.

The digital filter of the third embodiment has a data storage section 70, instead of the data storage section 10A shown in FIG. 3, which is different from the data storage section 10A of the second embodiment in configuration. The digital filter further comprises an output coefficient storage section 31, a pan coefficient storage section 32 in addition to the filter coefficient storage section 30 shown in FIG. 3, and a selector 33 for switching each coefficient of the filter coefficient storage section 30, output coefficient storage section 31 and pan coefficient storage section 32 and supplying the switched coefficient to a multiplier 20. The digital filter further includes a control section 60B to which functions are added corresponding to the output coefficient storage section 31, the pan coefficient storage section 32 and the selector 33.

The data storage section 70 includes a selector 71 which switches between input data DTIN and "0" data for interpolation in response to a control signal COM which is supplied from the control section 60B. Registers $72_1$, $72_2$ for effecting volume processing corresponding to a first channel and a second channel are connected to an output side of the selector 71. Further, the data storage section 70 includes shift registers $73_1$, $73_2$ for filter processing, shift registers $74_1$, $74_2$ for interpolation processing and registers $75_1$, $75_2$ for pan processing The respective shift registers $73_1$, $73_2$, and the shift registers $74_1$ and $74_2$ hold data which have been processed in an accumulative adder section 40 and fed back in response to shift signals SFT1, SFT2, SFT3 and SFT4, and sequentially shift data which have been held hitherto and store past multiple data. The registers $75_1$, $75_2$ hold data which have been processed in the accumulative adder section 40 and fed back.

Output sides of the shift registers $73_1$, $73_2$ of each stage are connected to input sides of selectors $76_1$, $76_2$ while output sides of the $74_1$, $74_2$ of each stage are connected to the input sides of selectors $77_1$, $77_2$. The selectors $76_1$ to $77_2$ select data of the shift registers $73_1$ to $74_2$ of each stage in response to a selection signal SELa which is supplied from the control section 60B and output the selected shift register.

Output sides of the selector $76_1$ to $77_2$ and those of the registers $72_1$ to $75_2$ are connected to an input side of a selector 78. The selector 78 selects one of input side data in response to selection signals SELb, SELc, SELd which are supplied from the control section 60B and outputs the selected input side data, and an output side of the selector 78 is connected to one input side of the multiplier 20. Other configurations of the digital filter are the same as that shown in FIG. 3.

FIG. 6 is a timing chart showing the operation of the digital filter shown in FIG. 5. The operation of the digital filter shown in FIG. 5 is described hereinafter with reference to FIG. 6.

When first channel data CH1 is inputted to the input data DTIN, the control signal COM for selecting the input data DTIN side is supplied from the control section 60B to the selector 71 of the data storage section 70, and the first channel data CH1 is held in the register $72_1$. Further, a clear signal CLR is supplied from the control section 60B to the accumulative adder section 40, and the content held in the accumulative adder section 40 is cleared to become 0.

Subsequently, the selection signals SELb, SELc, SELd for selecting the register $72_1$ is outputted from the control section 60B to the selector 78 and a selection signal SELe for selecting the output coefficient storage section 31 is supplied from the control section 60B to the selector 33. As a result, the first channel data CH1outputted from the register $72_1$ is multiplied by the volume coefficient outputted from the output coefficient storage section 31 in the multiplier 20. The result of multiplication in the multiplier 20 is held in the accumulative adder section 40 and is fed back to the data storage section 70. At this time, the shift signal SFT1is supplied from the control section 60B to the shift register $73_1$, and past first channel data held in the shift register $73_1$ and subjected to volume processing are sequentially shifted to subsequent stages, and the latest data which has been subjected to volume processing is stored in the first stage.

After the latest data is stored in the shift register $73_1$, the selector 78 is switched to the selector $76_1$ side by the control section 60B while the selector 33 is switched to the filter coefficient storage section 30 side. The data is subjected to the filter processing in the same manner as the second embodiment based on the first channel data which has been stored in the shift register $73_1$ and subjected to volume processing.

When the filter processing for the first channel data is completed, the result of the filter processing is stored in the shift register $74_1$, and subjected to interpolation processing in the same manner as the second embodiment based on the data which has been stored in the shift register $74_1$ and subjected to filter processing. When the interpolation processing for the first channel data is completed, the result of interpolation processing is stored in the register $75_1$.

Subsequently, the first channel data stored in the register $75_1$ and the second channel data stored in the register $75_2$ are sequentially read out and they are multiplied by each pan coefficient outputted from the pan coefficient storage section 32 in the multiplier 20. The first and second channel data which are respectively multiplied by the pan coefficient are added in the accumulative adder section 40, and it is held in a data output section 51, and outputted as the output data OUT1.

Likewise, when the second channel data CH2is inputted to the input data DTIN, it is subjected to the same processing as made for the first channel data by the registers $72_2$, $75_2$ and the shift resisters $73_2$, $74_2$ and the like so that data which has been resultantly processed is held in a data output section 52 and it is outputted as the output data OUT2.

The digital filter of the third embodiment includes the data storage section 70, the output coefficient storage section 31, the pan coefficient storage section 32 and the like which can effect the volume processing and the pan processing in addition to the interpolation processing, and also the control section 60B for controlling these storage sections. As a result, the digital filter of the third embodiment has an advantage that it can control an output level and obtain output data which is formed by mixing multiple input data in a given ratio in addition to the advantage of the second embodiment of the invention.

The invention is not limited to the first to third embodiments as set forth above, and it can be modified variously. For example, there are following modifications.

The data storage sections 10, 10A, 70 in FIGS. 1, 3 and 5 show configurations for briefly explaining the functions, and hence they are not limited to the illustrated configurations. They may be configured to achieve the same functions by controlling addresses appropriately by use of, e.g., a memory.

Although the digital filter shown in FIG. 5 has all of the interpolation processing function, volume processing function and pan processing function, it can be configured to have one or two of these functions, if need be.

In the pan coefficient storage section 32 shown in FIG. 5, mixing processing can be effected by setting the pan coefficient of the first and second channels at 50%.

Although it is explained that the input data DTIN is formed by time sharing and multiplying the first and the second channel data, it can be applied to three channels or more data. In this case, the number of the shift register 11 and selector 12 of the data storage section 10 may be prepared by the number of channels.

As described in detail above, the digital filter according to the first aspect of the invention includes the data storage section for storing therein the latest multiple input data relative to the multichannels, the multiplier and the accumulative adder section for sequentially reading out input data from the data storage section and multiplying the read out input data by filter coefficient and accumulatively adding the result of multiplication, and the control section. As a result, there are advantage that the filter processing can be effected even if the sampling frequencies of each channel are differentiated and a circuit configuration for effecting filter processing can be simplified.

The digital filter according to the second aspect of the invention includes the data storage section for storing therein interpolation data in addition to the input data. As a result, there is an advantage that the interpolation processing can be effected in addition to the advantage which is the same as the first aspect of the invention.

The digital filter according to the third aspect of the invention includes the output coefficient storage section for storing therein output coefficient, and multiplying the input data by the output coefficient to effect filter processing. As a result, there is an advantage that an output level can be easily adjusted in addition to the advantages of the first or second aspect of the invention.

The digital filter according to the fourth aspect of the invention includes the pan coefficient storage section for storing therein pan coefficient, and multiplying the output data by the pan coefficient to produce mixed output data. As a result, there is an advantage that the mixed output data can be easily produced in addition to the advantages of the first to third aspects of the invention.

What is claimed is:

1. A feedback digital filter for multichannel data, comprising:
    a control section;
    a data storage section for inputting and separately storing first channel data and second channel data, and selectively outputting the first channel data or the second channel data in response to a data selection signal from the control section;
    a coefficient storing section for storing volume and filter coefficients;
    a selector for selecting one of the coefficients and outputting the selected coefficient in response to a coefficient selection signal from the control section;
    a multiplier for multiplying the data output from the data storage section and the selected coefficient output from the selector, the multiplier outputting a multiplication result;
    an accumulative adder section for accumulatively adding the multiplication result and outputting an addition result;
    a feedback loop for storing the addition result in the data storage section in response to a storage signal from the control section, whereby in response to another data selection signal the addition result is supplied to the multiplier and multiplied by another, different coefficient from the coefficient storing section to result in another addition result; and
    a first data output section and a second data output section, coupled to the accumulative adder section, for outputting first channel output data and second channel output data from the digital filter, after a predetermined number of iterations of data fed back to the data storage section,
    wherein the multiplier multiplies data from the data storage section by both volume and filter coefficients,
    wherein the first channel data and the second channel data have different sampling frequencies, and
    wherein the data selection signal causes the first channel data to be inserted in every frame and the second channel data to be inserted once in two frames.

2. The feedback digital filter according to claim 1, wherein the coefficients stored by the coefficient storing section also include an output coefficient.

3. The feedback digital filter according to claim 1, wherein the coefficients stored by the storing section also include a pan coefficient of the first and second channels, and wherein the multiplier produces mixed output data mixed in a given ratio.

4. The feedback digital filter according to claim 1, wherein the control section controls operations of the accumulative adder section and the data output sections.

5. The feedback digital filter according to claim 1, further comprising a data input line coupled to the data storage section for inputting data to the digital filter, and wherein input data is formed by time sharing and multiplying the multichannel input data.

6. The feedback digital filter according to claim 1, wherein the data storage section includes a plurality of shift registers for receiving the data input to the digital filter and a plurality of selectors for selecting one of the stored data in response to the data selection signal, the shift registers and selectors being allocated respectively to the channels.

7. The feedback digital filter according to claim 1, wherein the accumulative adder circuit includes an adder for adding the multiplication result with a previous output result thereof and a data latch circuit for temporally storing the output result of the adder and providing the stored result to the adder.

8. The feedback digital filter according to claim 1, wherein the data storage section includes a first set of registers corresponding to the first data output circuit and a second set of registers corresponding to the second data output circuit.

9. The feedback digital filter according to claim 1, further comprising a third or additional channel data input and output.

10. A feedback digital filter for multichannel data, comprising:
a control section;
a data storage section for inputting and separately storing first channel data and second channel data, and selectively outputting the first channel data or the second channel data in response to a data selection signal from the control section;
a coefficient storing section for storing volume and filter coefficients;
a selector for selecting one of the coefficients and outputting the selected coefficient in response to a coefficient selection signal from the control section;
a multiplier for multiplying the data output from the data storage section and the coefficient output from the selector, the multiplier outputting a multiplication result;
an accumulative adder section for accumulatively adding the multiplication result and outputting an addition result, the accumulative adder section including an adder having a first input port that receives the multiplication result, the accumulative adder section also including a data latch in a first feedback loop between an output port of the adder and a second input port of the adder, the data latch being responsive to a feedback signal from the control section to cause the adder to repeatedly add the multiplication result with a previous output of the adder;
a second feedback loop for storing the addition result in the data storage section in response to a storage signal from the control section, whereby in response to another control signal the addition result is supplied to the multiplier and multiplied by another, different coefficient from the coefficient storing section to result in another addition result; and
a first data output section and a second data output section, coupled to the accumulative adder section, for outputting first channel output data and second channel output data from the digital filter,
wherein the multiplier multiplies data from the data storage section by both volume and filter coefficients,
wherein the first channel data and the second channel data have different sampling frequencies, and
wherein the data selection signal causes the first channel data to be inserted in every frame and the second channel data to be inserted once in two frames.

11. The feedback digital filter according to claim 10, wherein the control section controls operations of the accumulative adder section and the data output section.

12. The feedback digital filter according to claim 10, further comprising a data input line coupled to the data storage section for inputting data to the digital filter, and wherein input data is formed by time sharing and multiplying the multichannel input data.

13. The feedback digital filter according to claim 10, wherein the data storage section includes a plurality of shift registers for receiving the data input to the digital filter and a plurality of selectors for selecting one of the stored data in response to the data selection signal, the shift registers and selectors being allocated respectively to the channels.

14. The feedback digital filter according to claim 10, wherein the data storage section includes a first set of registers corresponding to the first data output section and a second set of registers corresponding to the second data output section.

15. A feedback digital filter for multichannel data, comprising:
a control section;
a data storage section for inputting and separately storing first channel data and second channel data, and selectively outputting the first channel data or the second channel data in response to a data selection signal from the control section;
a coefficient storing section for storing coefficients;
a selector for selecting one of the coefficients and outputting the selected coefficient in response to a coefficient selection signal from the control section;
a multiplier for multiplying the data output from the data storage section and the coefficient output from the selector, the multiplier outputting a multiplication result;
an accumulative adder section for accumulatively adding the multiplication result and outputting an addition result; and
a first data output section and a second data output section, coupled to the accumulative adder section, for outputting the addition result respectively as first channel output data and second channel output data from the digital filter,
wherein the first channel data and the second channel data have different sampling frequencies, and
wherein the first channel data and the second channel data have sampling frequencies in a ratio of 2:1, and the data selection signal causes the first channel data to be inserted in every frame and the second channel data to be inserted once in two frames.

* * * * *